US008288281B2

(12) United States Patent
Chen et al.

(10) Patent No.: US 8,288,281 B2
(45) Date of Patent: Oct. 16, 2012

(54) METHOD FOR REDUCING AMINE BASED CONTAMINANTS

(75) Inventors: Xiaomeng Chen, Poughkeepsie, NY (US); William Cote, Poughkeepsie, NY (US); Anthony K. Stamper, Williston, VT (US); Arthur C. Winslow, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 12/838,147

(22) Filed: Jul. 16, 2010

(65) Prior Publication Data

US 2010/0279508 A1 Nov. 4, 2010

Related U.S. Application Data

(63) Continuation of application No. 11/537,378, filed on Sep. 29, 2006, now Pat. No. 7,803,708, which is a continuation of application No. 10/605,926, filed on Nov. 6, 2003, now Pat. No. 7,153,776.

(60) Provisional application No. 60/429,828, filed on Nov. 27, 2002.

(51) Int. Cl.
*H01L 21/302* (2006.01)
(52) U.S. Cl. ......... 438/689; 438/710; 438/723; 438/725
(58) Field of Classification Search .................. 438/725, 438/778, 780–781
See application file for complete search history.

(56) References Cited

U.S. PATENT DOCUMENTS

| | | | |
|---|---|---|---|
| 5,612,254 A | 3/1997 | Mu et al. | |
| 5,910,453 A | 6/1999 | Gupta et al. | |
| 6,030,541 A | 2/2000 | Adkisson et al. | |
| 6,071,809 A | 6/2000 | Zhao | |
| 6,103,456 A | 8/2000 | Tobben et al. | |
| 6,140,220 A | 10/2000 | Lin | |
| 6,146,990 A | 11/2000 | Sung | |
| 6,159,661 A | 12/2000 | Huang et al. | |
| 6,232,237 B1 | 5/2001 | Tamaoka et al. | |
| 6,268,294 B1 | 7/2001 | Jang et al. | |
| 6,271,119 B1 | 8/2001 | Kishimoto | |
| 6,300,672 B1 | 10/2001 | Lee | |
| 6,319,821 B1 | 11/2001 | Liu et al. | |
| 6,458,689 B2 * | 10/2002 | Yu et al. | 438/631 |
| 6,518,166 B1 | 2/2003 | Chen et al. | |
| 6,541,367 B1 | 4/2003 | Mandal | |
| 6,583,047 B2 | 6/2003 | Daniels et al. | |
| 6,693,049 B2 | 2/2004 | Iguchi et al. | |
| 6,827,869 B2 | 12/2004 | Podlesnik et al. | |

(Continued)

OTHER PUBLICATIONS

Office Action dated Jul. 8, 2011 in U.S. Appl. No. 11/004,845.

(Continued)

*Primary Examiner* — Thanh Nguyen
(74) *Attorney, Agent, or Firm* — Anthony Canale; Roberts Mlotkowski Safran & Cole, P.C.

(57) ABSTRACT

Method for reducing resist poisoning. The method includes the steps of forming a first structure in a dielectric on a substrate, reducing amine related contaminants from the dielectric and the substrate prior to a formation of a second structure on the substrate such that the amine related contaminates will not diffuse out from either the substrate or the dielectric, wherein the reducing utilizes a plasma treatment which one of chemically ties up the amine related contaminates and binds, traps, or consumes the amine related contaminates during subsequent processing steps, forming the second structure on the substrate, and after the forming of the first structure, preventing poisoning of a resist layer in subsequent processing by the reducing.

19 Claims, 6 Drawing Sheets

U.S. PATENT DOCUMENTS

| | | |
|---|---|---|
| 6,905,968 B2 | 6/2005 | Hsieh et al. |
| 7,049,206 B2 | 5/2006 | Akram |
| 7,153,776 B2 | 12/2006 | Chen et al. |
| 2001/0023099 A1* | 9/2001 | Saito et al. ............ 438/241 |
| 2002/0081834 A1 | 6/2002 | Daniels et al. |
| 2002/0081855 A1* | 6/2002 | Jiang et al. ............ 438/694 |
| 2002/0090822 A1 | 7/2002 | Jiang et al. |
| 2002/0111037 A1 | 8/2002 | Kirkpatrick et al. |
| 2003/0077897 A1 | 4/2003 | Tsai et al. |
| 2003/0157794 A1 | 8/2003 | Agarwala et al. |
| 2004/0061177 A1 | 4/2004 | Merchant et al. |
| 2004/0087167 A1* | 5/2004 | Huang et al. ............ 438/694 |
| 2004/0180541 A1 | 9/2004 | Joshi |
| 2005/0014362 A1* | 1/2005 | Ho et al. ............ 438/637 |
| 2005/0124168 A1* | 6/2005 | Nagahara et al. ............ 438/745 |
| 2005/0221611 A1 | 10/2005 | Yamamoto |
| 2006/0166485 A1 | 7/2006 | Uglow et al. |
| 2007/0164442 A1 | 7/2007 | McTeer |

OTHER PUBLICATIONS

Office Action dated Jan. 21, 2011 in U.S. Appl. No. 11/004,845.
Office Action dated Dec. 19, 2011 in U.S. Appl. No. 11/004,845.
Notice of Allowance dated May 23, 2012 in U.S. Appl. No. 11/004,845.

* cited by examiner

TOP

CROSS-SECTION

METHOD FOR REDUCING AMINE BASED CONTAMINANTS

CROSS REFERENCE TO RELATED APPLICATIONS

The present application is a continuation of U.S. patent application Ser. No. 11/537,378, filed on Sep. 29, 2006, which is a continuation of U.S. patent application Ser. No. 10/605,926, filed on Nov. 6, 2003, the disclosures of which are expressly incorporated by reference herein in their entirety. This application also claims priority to U.S. Provisional Application No. 60/429,828, filed on Nov. 27, 2002, which is incorporated by reference herein in its entirety.

FIELD OF THE INVENTION

The invention generally relates a semiconductor device and method of manufacture and, more particularly, to a semiconductor device and method of manufacture which reduces the occurrence of resist poisoning.

BACKGROUND

To fabricate microelectronic semiconductor devices such as an integrated circuit (IC), many different layers of metal and insulation are selectively deposited on a silicon wafer. The insulation layers may be, for example, silicon dioxide, silicon oxynitride, fluorinated silicate glass (FSG), carbon doped, silicon dioxide or organosilicad glass (OSG) and the like. These insulation layers are deposited between the metal layers, i.e., intermetal dielectric (IMD) layers, and may act as electrical insulation therebetween or serve other known functions. These layers are typically deposited by any well known method such as, for example, plasma enhanced chemical vapor deposition (PECVD), chemical vapor deposition (CVD) or other processes.

The metal layers are interconnected by metallization through vias etched in the intervening insulation layers. To accomplish this, the stacked layers of metal and insulation undergo photolithographic processing to provide a pattern consistent with a predetermined IC design. By way of example, the top layer may be covered with a photo resist layer of photo-reactive polymeric material for patterning via a mask. A photolithographic process using either visible or ultraviolet light is then directed through the mask onto the photo resist layer to expose it in the mask pattern. An antireflective coating (ARC) layer such as PECVD SiON or spin on coating materials may be provided at the top portion of the wafer substrate to minimize reflection of light back to the photo resist layer for more uniform processing. The spin on ARCs may include AR-1 4™ (manufactured by Shipley Company, LLC of Marlborough, Mass.) or sacrificial light absorbing material (hereinafter referred generally as SLAM).

To form vias, for example, etching may be used to connect the metal layers deposited above and below the insulation or dielectric layers. The etching may be performed by anisotropic or isotropic etching as well as wet or dry etching, i.e., RIE (reactive ion etching), depending on the physical and chemical characteristics of the materials. To maximize the integration of the device components in very large scale integration (VLSI), it is necessary to increase the density of the components. This requires very strict tolerances in the etching and photolithographic processes.

However, it is known that resist poisoning can occur during the photolithographic processes. One example of resist poisoning during the lithographic process is caused by amine-induced poisoning of chemically amplified resists created during the patterning step. This may be caused when low k dielectrics are used for the IMD and interlevel dielectric (ILD). In a more general example, during the photolithographic process, contaminants that are incompatible with the photo-reactive polymeric material can migrate into the photo resist layer from the deposited film on the wafer, itself. These contaminants then poison the photo resist layer, which may result in a non-uniformity of the reaction by extraneous chemical interaction with the polymeric material. The resist poisoning also may result in poor resist sidewall profiles, resist scumming and large CD variations. This leads to the formation of a photo resist footing or pinching, depending on whether a positive negative or photo resist, respectively, is used during the process. This may also lead to an imperfect transfer of the photo resist pattern to the underlying layer or layers thus limiting the minimum spatial resolution of the IC.

One known method to solving this problem is to run a totally free nitrogen or nitrogen containing molecule free process. Examples of nitrogen containing molecules include $N_2$, $NH_3$, $NO$, $NO_2$, etc. However, all released FSG films are known to require either $N_2O$ (silane films) or $N_2$ (TEOS) films. In addition, silicon nitride or silicon carbon nitride is commonly employed as a copper cap under the IMD due to its superior electromigration performance as compared to silicon carbide. Finally, even if totally nitrogen free films are used, nitrogen from the ambient air, ARC/photoresist or nitrogen impurities contained in the deposition or etch gases can result in the presence of amines.

SUMMARY

In a first aspect of the invention, a method for reducing resist poisoning is provided. The method includes forming a first structure such as, for example, a trench or via in a dielectric on a substrate and reducing amine related contaminants from the dielectric and the substrate created after the formation of the first structure. The method further includes forming a second structure in the dielectric.

In another aspect of the invention, the first structure such as, for example, a trench or via in a dielectric on a substrate. A first organic film is formed on the substrate which is then heated and removed from the substrate. A second organic film is formed on the substrate and patterned to define a second structure in the dielectric.

In yet another aspect of the invention, a method for reducing resist poisoning includes forming a first structure such as, for example, a trench or via in a dielectric on a substrate and performing DHF wet etch with an approximate ratio of 100:1 on the dielectric. An anti-reflective coating (ARC) is formed on and then removed from the dielectric and the substrate. A second organic film is then formed on the substrate and patterning of the second organic film is performed to define a second structure in the dielectric.

In still another aspect of the invention, the first structure is formed in a dielectric on a substrate. A wet etching is provided on the formed first structure at approximately 3 nm 100:1 ratio of DHF. An organic film is applied on the exposed portions of the first structure, the dielectric and the substrate. The applying step includes spin coating of the organic film on the exposed portions, baking the organic film at approximately 100 degrees Celsius to 250 degrees Celsius and removing the organic film by dry stripping or plasma etching. The structure thus formed is then capped and a second organic film is formed on the substrate and patterned to define a second structure in the dielectric.

In an aspect of the invention, the structure is embedded in the dielectric with a vertical dielectric adjacent to a vertical sidewall of the structure. The vertical dielectric is deposited after the patterning and etching of a structure into the dielectric. The dielectric includes one of $SiO_2$, F-doped $SiO_2$, and $CH_3$-doped $SiO_2$. The vertical dielectric includes one of $SiO_2$, P-doped $SiO_2$, F-doped $SiO_2$, B-doped $SiO_2$, and B- and P-doped $SiO_2$.

DETAILED DESCRIPTION

This invention is directed to a semiconductor device and method of manufacture and, more particularly, to a semiconductor device and method of manufacture which reduces the occurrence of resist poisoning in the device. By reducing poisoning effects, the invention also significantly reduces photo resist footing or pinching, depending on the use of a positive negative or photo resist, respectively. The reduction of the poisoning allows for the fabrication of more densely packed integrated circuits (IC) with better resolution of interconnects and the like thereon. This, in turn, results in a superior performance of the IC. The formation of vias and troughs can be characterized as either a first structure or a second structure, depending on the architecture of the device.

Figure 1A:
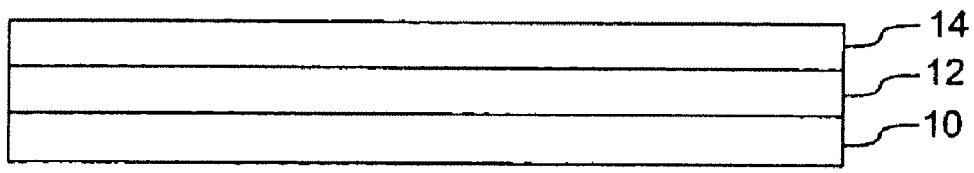
FIGS. 1a through 1e represent a typical fabrication technique for forming a layered structure using standard reactive ion etching (RIE) technique.

FIGS. 1a through 1 e represent a typical fabrication technique for forming a layered structure using standard reactive ion etching (RIE) technique. The RIE process should be well understood by those of ordinary skill in the art and is not discussed in great detail herein. In the schematics, a multilayer arrangement on a semiconductor substrate, which is typically a silicon substrate, is shown. The substrate may equally represent any type of film having known contaminants such as amines, for example.

Figure 1B:
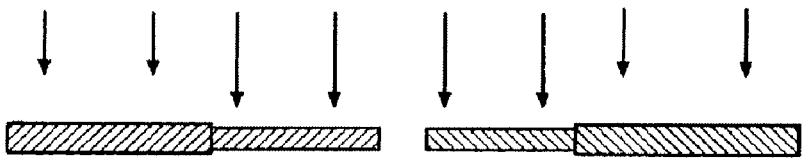
Figure 1B:
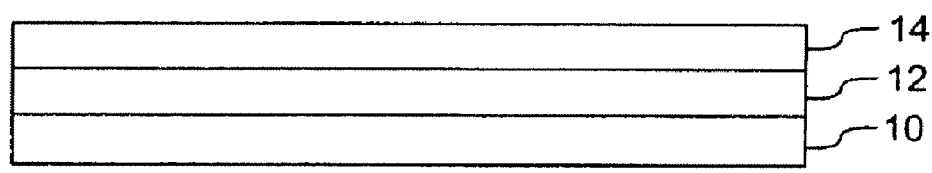
Figure 1C:

FIG. 1a shows a target layer 12 such as an oxide layer deposited on the substrate 10. In one embodiment, the oxide layer is approximately 8000 Å. Any known photo-resist or ARC/photo-resist 14 is then deposited on the oxide layer. FIG. 1b represents a photolithographic process performed on the photo-resist layer 14. In this representation, the photo-resist layer 14 is exposed to light through a mask 16 to form an image on the photo-resist layer 14. Once the exposure is complete, the exposed photo-resist layer 14 is developed in order to remove those portions of the exposed photo-resist. This is typically performed by a wet develop process using, for example, TMAH, as known in the art. The resulting pattern is shown in FIG. 1c.

Figure 1D:
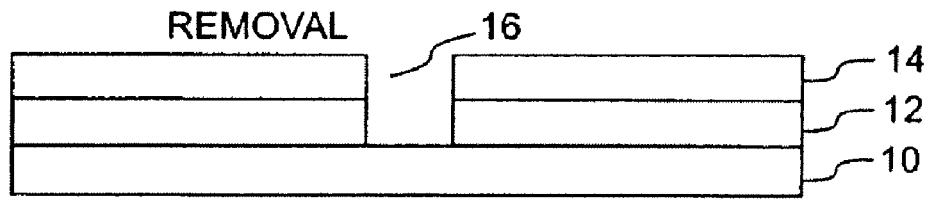

A reactive ion etching is then performed on the target layer 12 in order to form a first structure such as a via 16, for example (FIG. 1d). The first structure may equally be a wire trough, in some applications. The remaining portions of the photo-resist layer 14 are then removed by, for example, dry strip techniques (FIG. 1 e) using, for example, $O_2$, $H_2$, $N_2$, plasmas or damascene plasmas, all known in the art. In one embodiment, the first structure (i.e., a via) is at a depth of about 7500 Å. It should be well understood by those of ordinary skill in the art, though, that other depths are also contemplated by the invention. At the end of this process, contaminants are known to be associated with the substrate 10 or target layer 12 basically due to the etching process, to this stage.

Figure 1E:
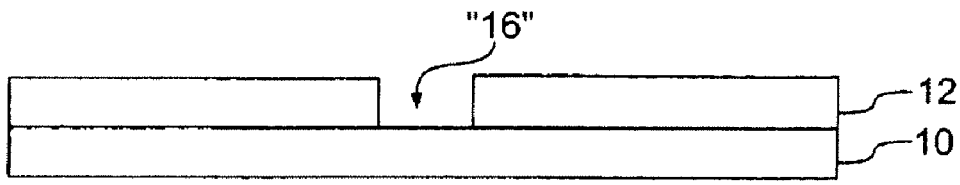
Figure 2:
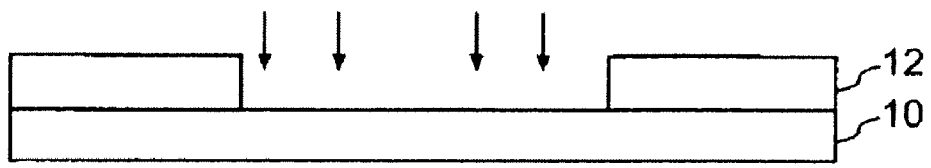
FIG. 2 represents a first aspect of the invention.

FIG. 2 is representative of a first embodiment of the invention. In FIG. 2, the structure of FIG. 1e is subjected to a plasma wafer treatment. In one embodiment, the plasma wafer treatment is an $N_2O$ plasma treatment performed at approximately 400 degrees Celsius. In one aspect, the $N_2O$ will chemically tie up the contaminants such that the contaminants will not diffuse out from either the substrate layer 10 or the target layer 12, i.e., oxide layer. In another aspect, it is assumed that the $N_2O$ passivates the exposed layer in order to bind, trap or consume the contaminants such that amine, for example, will not diffuse out from the exposed layers during subsequent etching processes. In either scenario, it is known that the plasma wafer treatment of the invention prevents poisoning of the resist layer in subsequent processing steps. An alternative embodiment uses a $N_2O$, $O_2$ or $H_2$ plasma with no deposition in order to achieve the same effect. The time for the $N_2O$, $O_2$ or $H_2$ plasma may be from one to 60 seconds, for example, alternative, the wafer may be baked for approximately 0.1 to 10 minutes at 400 degrees Celsius to partially outgas amines.

Figure 3A:
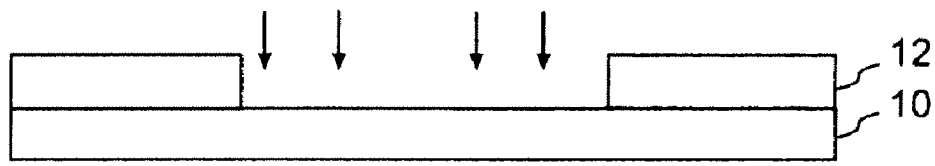
FIGS. 3a through 3c represent another aspect of the invention.
Figure 3B:
Figure 3C:
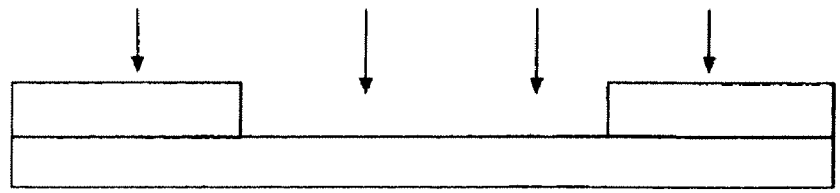

FIGS. 3a through 3c represent another aspect of the invention. In FIG. 3a, an optional wet etching of approximately 30 seconds at 25 degrees Celsius, 100:1 ratio of DHF (dilute hydrofluoric acid) is performed on the device of FIG. 1e. It should be recognized by those of ordinary skill in the art that other ratios, times or temperatures of the DHF may also be used in accordance with the principles of the invention. In FIG. 3b, an organic film such as an antireflective coating 18 (ARC) is applied to the device of FIG. 1e, with or without the optional wet etching being performed. In one aspect, the ARC is spin coated onto the entire exposed surfaces of the target layer 12 and the substrate 10. The ARC is then baked at approximately 100 degrees Celsius to 250 degrees Celsius and more preferably between 150 degrees Celsius to 220 degrees Celsius in order to diffuse the amine based contaminants into the ARC. The ARC is removed by dry stripping or plasma etching, similar to that described above with reference to the photo-resist layer 14. This latter step is shown in FIG. 3c. The ARC may be exposed to UV light.

Figure 4A:
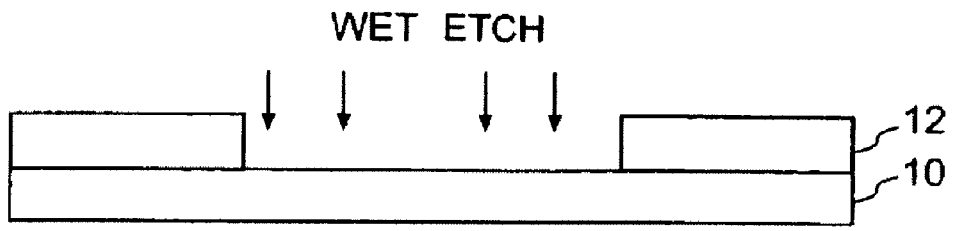
FIGS. 4a through 4d represent another aspect of the invention.
Figure 4B:
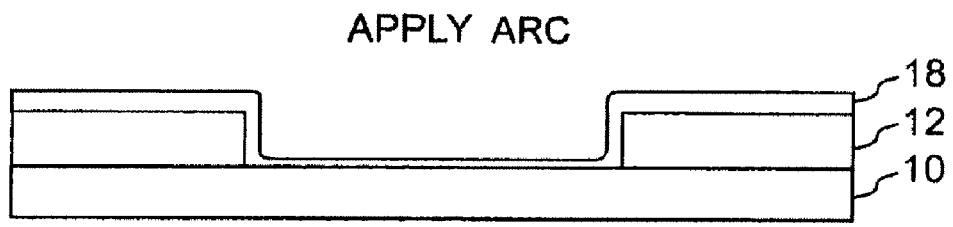
Figure 4C:
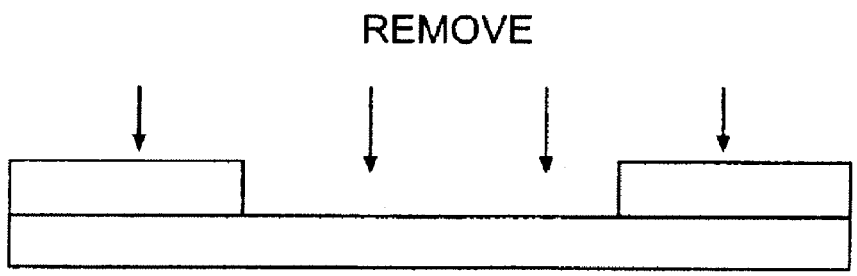
Figure 4D:
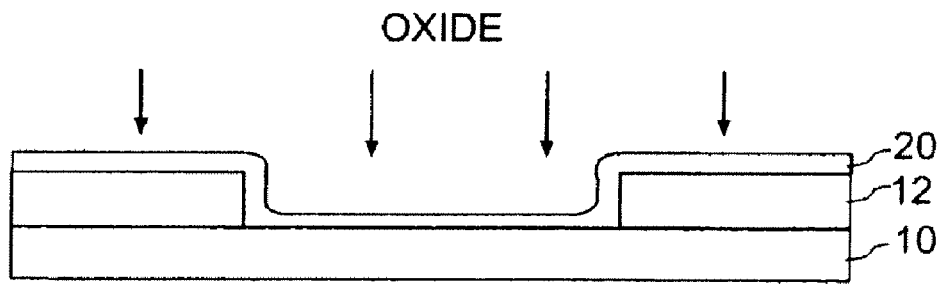

FIGS. 4a through 4d represent another aspect of the invention. FIGS. 4a through 4c are substantially identical to those steps shown and described with reference to FIGS. 3a through 3c, and are not described again. FIG. 4d shows the deposition of a thin plasma cap 20. The cap 20 can be deposited by any known method such as, for example, PECVD, HDPCVD, SACVD, APCVD and the like at a temperature ranging from 25 degrees Celsius to 500 degrees Celsius, and preferably at 400 degrees Celsius. In one aspect, the oxide cap 20 is approximately 25 nm; however, other thicknesses are also contemplated for implementation by the invention. In one embodiment, prior to the deposition of the oxide cap, an annealing process is performed at about 400 degrees Celsius for about 60 seconds. In another embodiment, prior to the deposition of the oxide layer, a $N_2O$ or $O_2$ plasma etch at an approximate temperature of 400 degrees Celsius is performed. (These steps may be represented by FIG. 4c.) The silicon dioxide cap will seal any of the remaining amine based contaminants in the layers 10 and 12. In the process described with reference to FIGS. 4a-dc, any amine based contaminants will not diffuse out during subsequent processing steps to contaminate the resulting device.

FIGS. 5a through 5d show a typical trough lithographic process after the contaminants such as, for example, amine based contaminants, are constrained, bound or capped in the lower layers 10 and 12. This process will now provide a second structure such as channels or troughs in the target layer 12, but without any contaminants from the resist or other device layers contaminating the device during this further processing stage. In another aspect, the second structure may be a via. In accordance with the invention, more accurate troughs can be achieved, increasing the density of the device in addition to its performance.

Figure 5A:
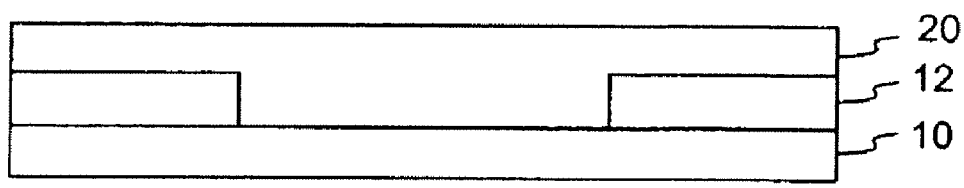
FIGS. 5a through 5d show a trough lithographic process after contaminants are constrained, bound or capped in lower layers.
Figure 5B:
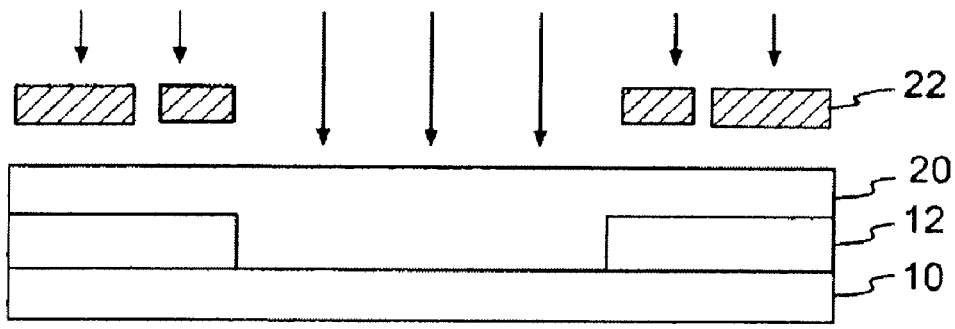
Figure 5C:
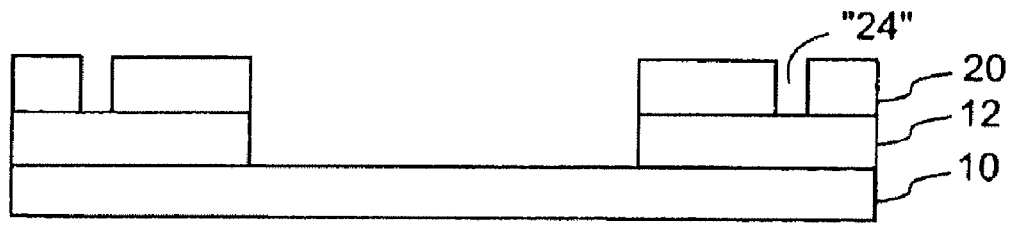
Figure 5D:
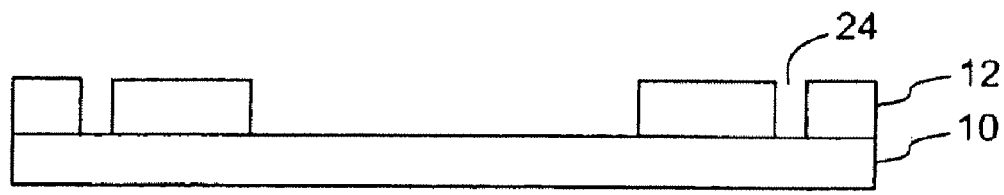

In particular, FIG. 5a shows a known photo-resist 20 deposited on the oxide layer 12. FIG. 5b represents a photo-lithographic process performed on the photo-resist layer 20. In this representation, the photo-resist layer 20 is exposed to light through a mask 22 to form channels or troughs in the photo-resist layer 20. Once the exposure is complete, the exposed photo-resist layer 20 is developed in order to remove those portions of the exposed photo-resist. The resulting pattern is shown in FIG. 5c. A reactive ion etching is then performed on the target layer 12 in order to form one or more channels 24, for example (FIG. 5d). The remaining portions of the photo-resist layer 18 are then removed by, for example, dry strip techniques (FIG. 5d) to form the channels "C" of the final device structure.

It should be understood that the steps shown in FIG. 2, FIGS. 3a through 3c or FIGS. 4a through 4d may be repeated if other structures are to be formed on any overlaying layers. Likewise, in any multilayered structure, the steps shown and described herein may be repeated to reduce or eliminate contaminants during further processing. This is mainly due to the fact that more contaminants may have formed on or diffused into the layers, now shown, or additionally formed layers due to the use of additional resist layers and etching or other processing steps.

Table 1, reproduced below, is representative of the advantages achieved by the aspects of the invention, compared to conventional methods. The data in Table 1 and table 2 were generated using duel damascene wires and vias with 200 nm minimum critical dimension. In Table 1, it is shown that a conventional method of fabrication yields approximately 15% non-defective devices (chips). In stark improvement, the use of the aspect of FIG. 2 shows a yield of 60% of non-defective devices (chips). Of even greater yield is the aspect of the invention of FIGS. 3a through 3d which show a yield of 75% of non-defective devices (chips). The aspect of the invention of FIGS. 4a through 4d shows a yield of 90% of non-defective devices (chips). This improvement over the standard fabrication processes is attributable to the elimination of contaminants during the fabrication processes.

TABLE 1

| Process | #lots | % chips with greater than 0 resist poisoning defect yield |
|---|---|---|
| Standard process | 6 | 15% |
| Added lithographic work | 24 | 60% |

TABLE 1-continued

| Process | #lots | % chips with greater than 0 resist poisoning defect yield |
|---|---|---|
| Added DHF clean and lithographic work | 38 | 75% |
| Added DHF clean + litho work + thin oxide cap | 50 | 90% |

Table 2 represents the critical dimension (CD) or diameter of the via using either a 40 mJ or 70 mJ dose. As seen in Table 2, below, the standard fabrication process, at 40 mJ, provides an approximate via size of 200 nm with "scummed" edges. That is, the edges of the via using the standard fabrication process has resist that does not completely clear out thus resulting in blurred edges. In stark contrast, the aspects of the invention result in vias with clearly defined edges. Additionally, the via are also larger due to the suppression of the poisoning.

TABLE 2

| Process | Via 40 mJ dose | Via cd 70 mJ dose |
|---|---|---|
| Standard | Scummed approx. 200 nm | 360 nm |
| 400C oxygen plasma | 400 nm | |
| DHF + thin oxide cap | 400 nm | 500 nm |

In one embodiment, the formation of the via on the target layer is a first structure and the formation of the trough is a second structure. The first and second structure, however, can be switched, depending on the design of the device. In one aspect, the dimension of the first structure is about 200 nm and the photolithographic exposure wavelength is about 248 nm. Of course, those of ordinary skill in the art will readily recognize that other dimensions and photographic minimums are also contemplated by the invention and that the above example is only one illustrative embodiment of the invention.

Figure 6A:
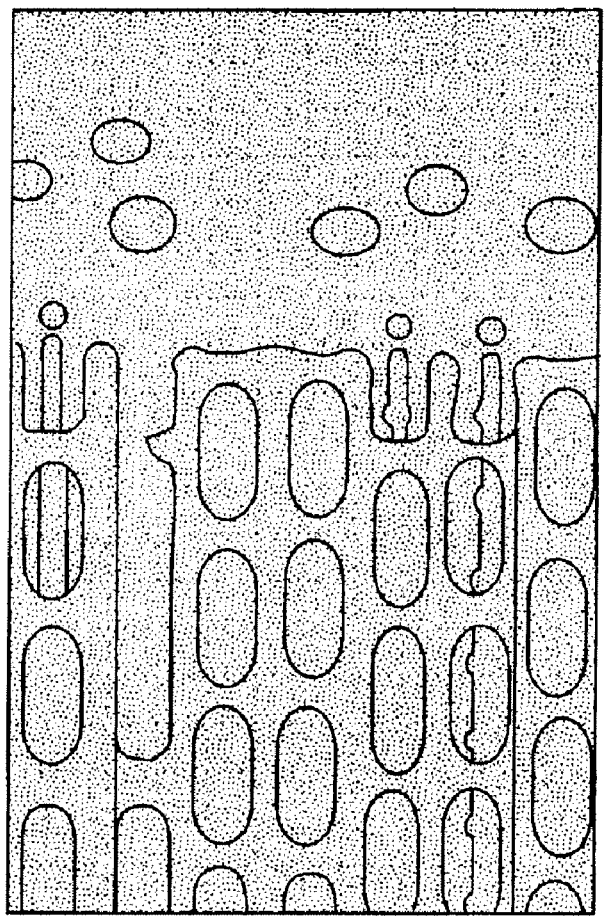
FIG. 6a is a representation of a top view of a device using the methods of the invention.
Figure 6B:
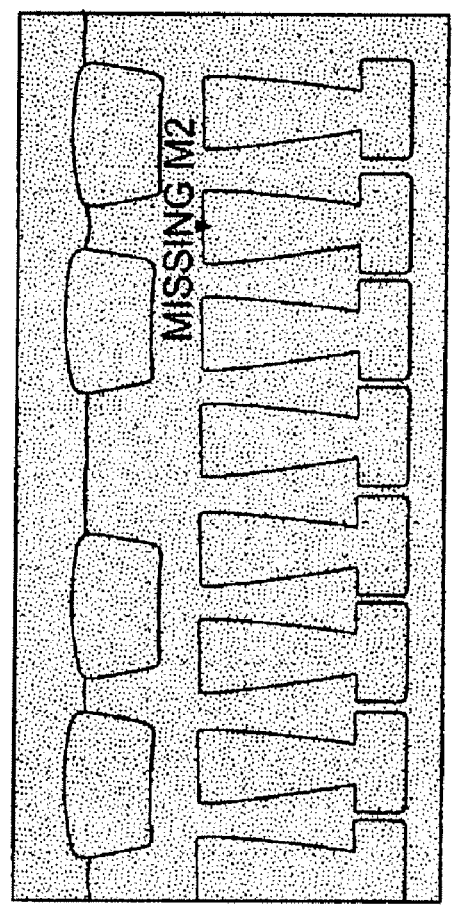
FIG. 6b is a representation of a cross sectional side view of a device using methods of the invention.

FIG. 6a shows a top view of an example of the device of the invention with both a first structure and a second structure. FIG. 6b shows a cross sectional view of an example of the device of the invention. The views of FIGS. 6a and 6b are taken in a scanning electron microscope of a dual damascene copper wire and via with resist poisoning.

Figure 7:
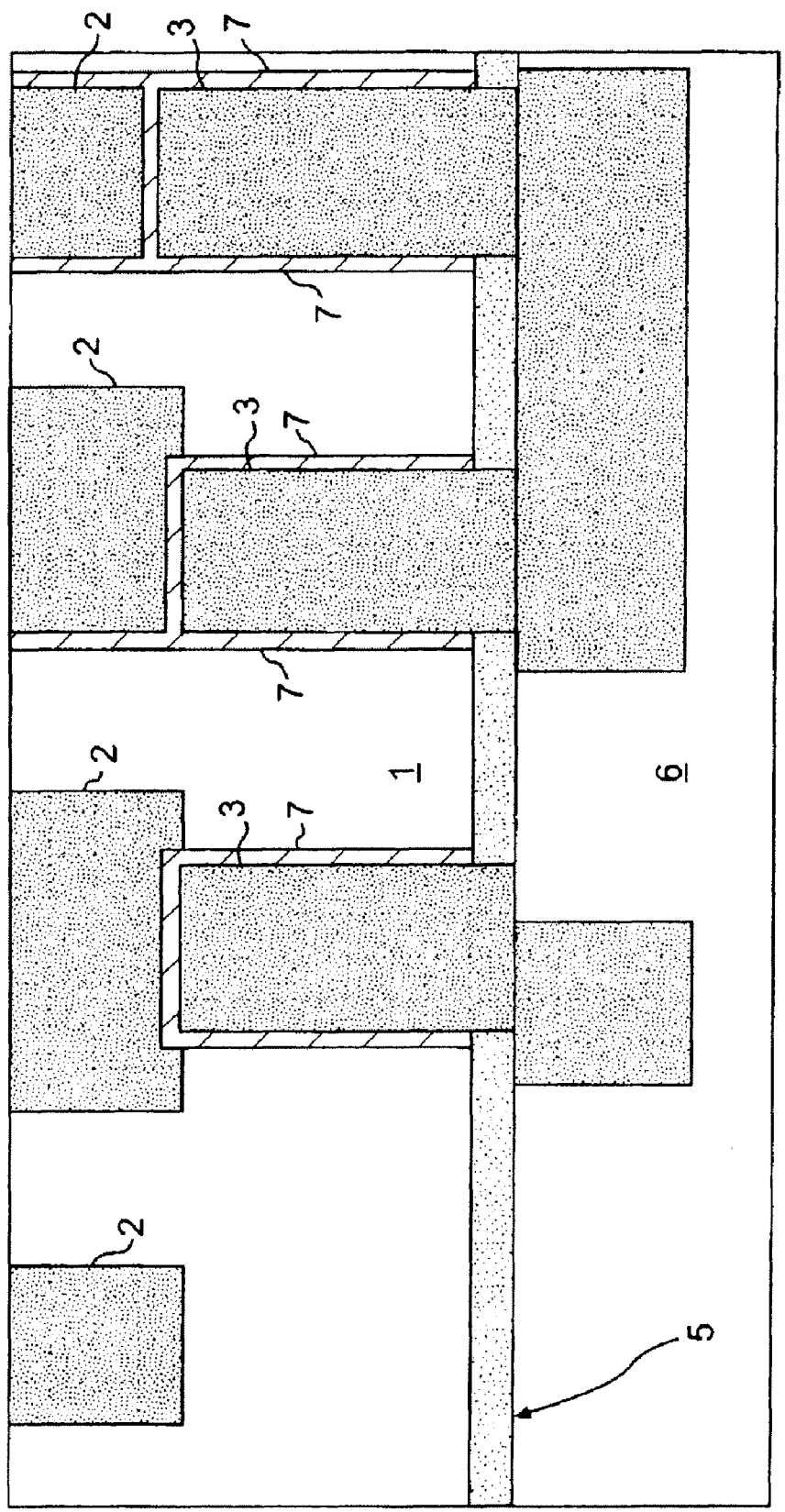
FIG. 7 shows an embodiment of the structure of the invention.

It is contemplated by the invention that the $SiO_2$ thin oxide cap can be a sacrificial film (i.e., it is removed during the post via RIE clean, trough RIE, post trough RIE clean, or other steps). Alternatively, the $SiO_2$ thin oxide cap can remain on the wafer post-metallization, as shown in FIG. 7, layer 7, for example. More particularly, FIG. 7 shows dual damascene wire 2 and via 3 contacting the previous metal level 4. The wire 2 and via 3 are embedded in dielectric 1 and the wire 4 is embedded in dielectric 6. An optional via RIE stop layer or copper diffusion barrier 5 is deposited over dielectric layer 6 and wire 4. If the $SiO_2$ thin oxide cap is not removed during processing, then it will remain on the wafer as shown by layer 7.

In an aspect of the invention, the structure is embedded in the dielectric with a vertical dielectric adjacent to a vertical sidewall of the structure. The vertical dielectric is deposited after the patterning and etching of a structure into the dielectric. The dielectric includes one of $SiO_2$, F-doped $SiO_2$, and $CH_3$-doped $SiO_2$. The vertical dielectric includes one of $SiO_2$, P-doped $SiO_2$, F-doped $SiO_2$, B-doped $SiO_2$, and B- and P-doped $SiO_2$.

What is claimed is:

1. A method for reducing resist poisoning comprising the steps of:
   forming a first trench in a dielectric layer on a substrate, wherein the trench defines a portion of a surface of the substrate;
   forming a first organic film on and contacting the portion of the surface of the substrate defined by the trench;
   heating the first organic film;
   removing the first organic film from the substrate;
   forming a photoresist on and contacting the portion of the surface of the substrate defined by the trench and on an upper surface of the dielectric layer, wherein the photoresist is formed after the first organic film is removed;
   patterning the photoresist;
   forming a second trench in the dielectric layer through the patterned photoresist.

2. The method of claim 1, wherein the first organic film comprises ARC (anti-reflective coating).

3. The method of claim 1, wherein the heating step comprises annealing at a temperature from about 100 to about 250 degrees Celsius.

4. The method of claim 1, wherein the removing step comprises a plasma etch.

5. The method of claim 1, wherein before the forming of the first trench, performing a 100:1 DHF wet etch of the dielectric.

6. The method of claim 1, wherein after the removing step, depositing a non-amine dielectric having a thickness of about 25 nm.

7. The method of claim 6, wherein the non-amine dielectric comprises oxide.

8. The method of claim 6, wherein before the depositing step, performing an anneal at a temperature of about 400 degrees Celsius for about 60 seconds.

9. The method of claim 6, wherein before the depositing step, performing an $N_2O$ or $O_2$ plasma etch at a temperature of about 400 degrees Celsius.

10. The method of claim 1, wherein after the heating step, exposing the first organic film to UV light.

11. The method of claim 1, wherein the first structure comprises one of a via and a trough, and the second structure comprises one of a trough and a via.

12. The method of claim 1, wherein a critical dimension of the first structure is about 200 nm and the photolithographic minimum is about 248 nm.

13. The method of claim 1, wherein the first organic film and the photoresist are formed on the portion of the surface of the substrate defined by the trench at different times.

14. The method of claim 1, wherein:
   the forming the first organic film comprises forming the first organic film on the portion of the surface of the substrate defined by the trench;
   the removing the first organic film comprises removing the first organic film from the portion of the surface of the substrate defined by the trench; and
   the forming the photoresist comprises forming the defined by the trench on the portion of the surface of the substrate defined by the trench after the removing the first organic film.

15. A method for reducing resist poisoning comprising the steps of:
   forming a first structure in a dielectric on a substrate;
   performing a DHF wet etch on the dielectric at a ratio of about 100:1;
   forming an anti-reflective coating (ARC) on the dielectric and a portion of a surface of the substrate defined by the first structure;
   baking the ARC in order to diffuse amine based contaminants into the ARC;
   removing the ARC after the baking the ARC; and
   forming a second organic film on the portion of the surface of the substrate defined by the first structure and patterning the second organic film to define a second structure in the dielectric.

16. The method of claim 15, further comprising the step of forming an oxide cap on the dielectric and the substrate prior to forming the second organic film step.

17. The method of claim 15, wherein the baking the ARC includes baking the ARC between approximately 175 degrees Celsius to 220 degrees Celsius and dry step removal of the ARC to eliminate amine based contaminants.

18. The method of claim 15, wherein the ARC and the second organic film are formed at different times on the same portion of the surface the substrate defined by the first structure.

19. The method of claim 15, wherein the forming the second organic film comprises forming the second organic film on the same portion of the surface the substrate from which the ARC was removed.

* * * * *